United States Patent [19]

Weaver et al.

[11] Patent Number: 4,799,028

[45] Date of Patent: Jan. 17, 1989

[54] ZERO PHASE SHIFT ACTIVE MICROWAVE OSCILLATORS WITH RESISTIVE FEEDBACK IN FIELD EFFECT TRANSISTOR AMPLIFIERS

[75] Inventors: Gary R. Weaver, Manhattan Beach; Bryce M. Smith, Los Angeles; Gregory L. Horvath, Mountain View; Bernard L. Walsh, Jr., Northridge, all of Calif.

[73] Assignee: Hughes Aircraft Company, Los Angeles, Calif.

[21] Appl. No.: 881,438

[22] Filed: Jul. 2, 1986

[51] Int. Cl.$^4$ ............................................. H03B 5/20
[52] U.S. Cl. .................................. 331/57; 331/108 B; 331/135
[58] Field of Search ............... 331/57, 108 B, 116 FE, 331/117 FE, 135, 136, 137, 108 R; 330/302, 109, 107

[56] References Cited

U.S. PATENT DOCUMENTS

3,737,806 6/1973 Darrow ........................ 331/108 B X
3,764,745 10/1973 Bottcher et al. ................. 330/302 X

FOREIGN PATENT DOCUMENTS

1303935 5/1977 Fed. Rep. of Germany ........ 331/57

OTHER PUBLICATIONS

Micro-Electronics, by Jacob Millman Phd., Columbia University, McGraw Hill Book Company, copyright 1979, chapter 17, Waveshaping and Waveform Generators, pp. 649-657.

Microwaves & RF, Aug. 1984, published by Hayden Publishing Co., Hasbrouck Heights, N.J., title: Choosing Devices for Quiet Oscillators, pp. 166-170.

Avantek Inc., Santa Clara, Calif., Semiconductor Device Catalog, 1985, copyright 1984, pp. 92-95.

Wireless World, Mar. 1968, p. 25.

*Primary Examiner*—Eugene R. LaRoche
*Assistant Examiner*—Robert J. Pascal
*Attorney, Agent, or Firm*—S. M. Mitchell; M. J. Meltzer; A. W. Karambelas

[57] ABSTRACT

A microwave oscillator in a loop configuration comprises three substantially identical amplifier stages each having its own phase shift at a selected oscillating frequency. A transmission delay element having a phase shift at the selected oscillating frequency, is also in the loop configuration, so that the oscillator has zero phase shift around the loop at the oscillating frequency. Each amplifier stage has at least one active component with resistive feedback, which is connected to DC blocking and filtering capacitors. Capacitor values between 2.2 and 5.1 pf are used making the oscillator design amenable to cost effective conventional hybrid and semiconductor processes.

20 Claims, 2 Drawing Sheets

ZERO PHASE SHIFT ACTIVE MICROWAVE OSCILLATORS WITH RESISTIVE FEEDBACK IN FIELD EFFECT TRANSISTOR AMPLIFIERS

BACKGROUND

The present invention relates to oscillator circuits and more specifically to microwave oscillator circuits.

Hybrid technology and semiconductor monolithic processes have been used to fabricate a wide variety of microelectronic components, circuits and systems with limitations as to the type of components that can be conveniently and economically manufactured. Devices such as inductors or capacitors usually require a large substrate area because these devices are usually specified with relatively high capacitive or inductive values which can only be realized when the devices have large physical geometries. Generally, large physical devices decrease the yields of hybrid and semiconductor processes.

Physically large devices also have correspondingly large intrinsic parasitic parameters which cause large component tolerances and which tend to reduce the operating frequency and tend to reduce the predictability of the operating conditions of the circuits employing the large devices. As such, large physical devices are avoided when designing hybrid or monolithic semiconductor microwave electronic circuits which may operate in the 1 to 10 GHz range.

Heretofore oscillator designs for RF and microwave circuits have incorporated discrete active elements such as bipolar transistors. Typically, these oscillators have a single active transistor coupled to discrete inductive-capacitive resonating components.

For example, a bipolar transistor with an inductor connected across its base-collector junction, a capacitor connected across its base-emitter junction, and a second capacitor connected across its emitter-collector junction is such a resonant oscillator. This bipolar oscillator requires large capacitive and inductive values. The hybrid or semiconductor manufacturing process used to fabricate this design suffers from poor yields and high fabrication costs.

Furthermore, a problem with bipolar semiconductor technology is that it generally requires more power than, for example, a corresponding circuit processed by metal-oxide-semiconductor technology using field effect transistors (FETs). Moreover, the bipolar resonant oscillator using a single active component also produces harmonics which may be coupled into surrounding circuits as unwanted noise.

A single active transistor oscillator may comprise a FET amplifier coupled to cascaded capacitor-resistor networks. A conventional design of a FET amplifier may have the source of the FET connected to ground while the drain of the FET is connected to a positive power supply through a drain resistor. This FET amplifier of conventional design is then followed by a plurality of cascaded arrangements each having a capacitor (C) and a resistor (R) with the input of the cascaded RC networks connected to the drain and with the output of the last RC network being fedback to the gate of the FET. This FET amplifier shifts by 180 degrees the phase of any voltage which appears on the gate respecting the drain while the network of cascaded RC networks shifts the phase by an additional amount. At some frequency, the phase shift introduced by the cascaded RC networks will be precisely 180 degrees, at which frequency, the total phase shift from the gate to the drain through the cascaded RC network will be zero module 360 degrees). This particular frequency will be the one at which the circuit will oscillate. This single active FET oscillator again suffers from requiring relatively large capacitive values with correspondingly poor process yields and with a reduced and unpredictable oscillating frequency.

Typically, single active resonant oscillators and single active FET oscillators require capacitors or inductors having large inductive and capacitive values which dictate that these components disadvantageously have relatively large physical sizes. Hence, the heretofore single active component oscillator circuits suffer from poor yields, imprecise and low oscillating frequencies, the generation of harmonics and unwanted noise and large physical geometries. These and other disadvantages are solved using cascaded resistive feedback active FET amplifiers in a zero-phase-shift-loop microwave oscillator.

SUMMARY

An object of the present invention is to provide an improved oscillator design.

Another object of the present invention is to provide an oscillator design which employs small capacitive values.

Yet another object of the present invention is to provide an improved oscillator design which employs small physical components which are conveniently manufactured using conventional hybrid or semiconductor monolithic processes.

Still another object of the present invention is to provide an oscillator design with a precise operating frequency which design substantially attenuates higher harmonics thereby reducing noise which may be coupled into surrounding circuits.

Still a further object of the present invention is to provide an improved oscillator design comprising cascaded active field effect transistor amplifiers with resistive feedback, which cascaded amplifiers are in turn connected in a feedback loop configuration through a transmission delay thereby producing a cumulative oscillator zero phase shift with a predictable and repeatable oscillating frequency.

An oscillator circuit formed in a loop configuration comprises a plurality of substantially identical active field effect transistor amplifier stages and a transmission delay element. Each amplifier stage has the same phase shift at the oscillating frequency. The transmission delay element has a phase shift so that the total loop phase is zero degrees at the oscillating frequency. The amplifier stages need only use a single active component, such as a field effect transistor (FET), with resistive feedback.

A FET amplifier stage comprises a high operating frequency FET with the source terminal connected to ground and the gate terminal connected to the drain terminal through a feedback resistor. At the operating oscillating frequency, the FET amplifier stage produces a known phase shift. A plurality of FET amplifier stages are cascaded to produce a cumulative phase shift.

If the cumulative phase of the cascaded amplifier stages does not equal zero (modulo 360 degrees), then a transmission delay element is connected between the output of the last stage and the input of the first stage so as to obtain a zero phase shift through the oscillator loop, and hence, an oscillating circuit.

For biasing, DC blocking and phase shifting, each stage is provided with (1) a DC blocking and feedback capacitor connected in series with the feedback resistor both of which are connected between the source and the drain of the FET, (2) a parallel resistor-capacitor network connected between the drain and ground, (3) another DC blocking capacitor connected between the drain of the FET and the gate of another FET of the succeeding stage, and (4) bias resistors connected between the drain and a positive power supply and connected between the gate and a negative power supply.

Each separate FET amplifier stage is coupled to the next stage with each stage producing a given phase shift at a particular operating frequency. The resistive-capacitive feedback and resistor-capacitor network combine to produce a predictable phase shift identical in each stage at the desire operating frequency. The capacitive values may be in the 1 to 5 pico farad range, which values prescribe small capacitor geometries.

Additionally, each FET amplifier stage tends to produce little harmonic noise while the parallel resistor-capacitor network tends to filter any higher harmonics. The cascaded resistive feedback active amplifier oscillator design employs a plurality of active amplifiers and does not require cascaded capacitive-resistive networks and does not require inductive capacitive resonant components. Hence, the cascaded active amplifier with resistive feedback in the oscillator provides for smaller capacitor component geometries with an improved predictable oscillating frequency and with reduced harmonic noise. These and other advantages will become more apparent in the following description of the preferred embodiment.

DRAWING DESCRIPTIONS

PREFERRED EMBODIMENT

Figure 1:
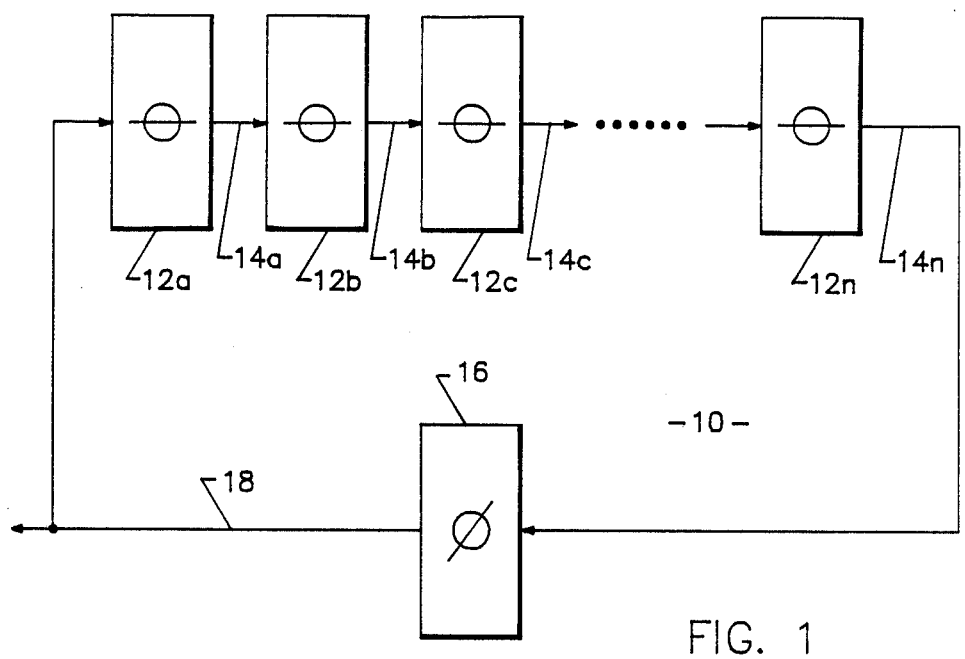
FIG. 1 is a block diagram of a zero phase shift active oscillator.

Referring to FIG. 1, a zero phase shift active oscillator 10 comprises a plurality of cascaded active amplifier stages 12 connected in series. The amplifier stages 12 are substantially identical to each other. Each amplifier stage 12 has an output signal on a stage output line 14 which is connected to an input of the next stage 12. The last amplifier stage 12n is connected to the input of the first amplifier stage 12a through a transmission delay element 16. The output of the transmission delay element 16 is presented on the oscillator output line 18 which is connected to the input of the first amplifier stage 12a. Thus, the zero phase shift active oscillator 10 comprises a plurality of cascaded active amplifiers 12 and a transmission delay element 16 connected in a loop configuration.

Each amplifier stage 12 of the oscillator 10 produces an amplifier phase shift $\theta$ at the oscillating frequency of the oscillator 10. Hence, the cumulative phase shift of the cascaded amplifier stages 12 is equal to the number (N) of amplifier stages multiplied by the phase shift $\theta$.

The transmission delay element 16 produces a transmission phase shift equal to $\phi$ at the oscillating frequency. The value of the transmission phase shift $\phi$ is determined to be equal to zero (modulo 360 degrees) minus the cumulative phase shift ($N\theta$). Thus, at the oscillating frequency, $0 = N\theta + \phi$ (modulo 360 degrees).

If the cumulative phase shift $N\theta$ of the amplifier stages 12 is equal to zero (modulo 360 degrees) then the transmission delay element 16 is not required. In this instance, the output of the last amplifier stage 12n is connected directly to the input of the first amplifier stage 12a.

Figure 2:
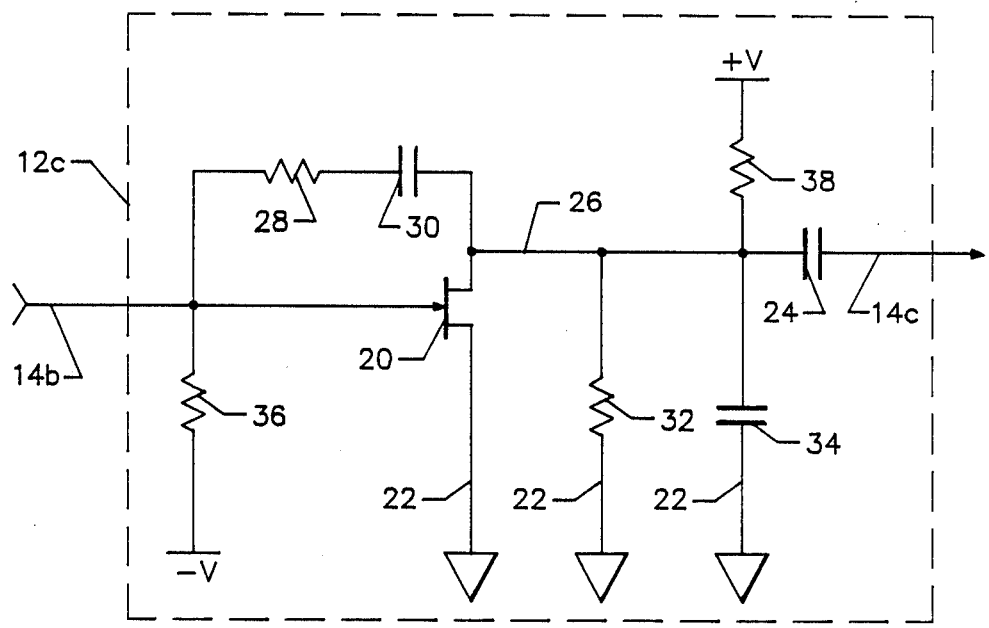
FIG. 2 is a schematic diagram of an active field effect transistor amplifier stage with resistive feedback.

Referring to FIGS. 1 and 2, the amplifier stage 12c includes a field effect transistor (FET) 20 having its source terminal connected to a ground line 22 which is grounded. The input line 14b of the amplifier stage 12c, which line 14b is also the output line of the preceding amplifier stage 12b, is connected to the gate terminal of the FET 20. The output line 14c of the amplifier stage 12c is connected to the drain terminal of the FET 20 through a DC blocking capacitor 24. The DC blocking capacitor 24 couples a FET output signal on a FET output line 26 onto the stage output line 14c.

A feedback resistor 28 and a feedback capacitor 30 are connected in series between the FET output line 26 and the input line 14b, that is, between the drain and gate of the FET 20. This feedback configuration of the resistor 28 and capacitor 30 produces a phase shift between the signal on the input line 14b and the FET output signal on the FET output line 26 at the oscillating frequency of the oscillator 10.

A filter resistor 32 and a filter capacitor 34 are connected in parallel between the FET output line 26 and the ground line 22. The filter resistor 32 and the filter capacitor 34 combine to produce a filtering effect of the FET output signal on the FET output line 26 thereby attenuating any higher harmonics created by the feedback-FET circuit comprising the FET 20, feedback resistor 28 and feedback capacitor 30.

A gate bias resistor 36 is connected between the gate of the FET 20 and a minus supply voltage source $-V$ so as to negatively bias the gate of the FET 20. A drain bias resistor 38 is connected between the drain of the FET 20 and a positive supply voltage source $+V$ so as to positively bias the drain of the FET 20. The bias resistors 36 and 38 are used to bias the FET 20 into the operating range of the FET 20 as is well known in the art.

However, differing bias schemes may be used, for example, the negative power source $-V$ may to set to zero volts with the source of the FET 20 connected to an additional parallel resistive-capacitive network which in turn is connected to a ground power source. This later configuration is commonly called a self or source biasing scheme.

The filtering effect of the resistor 32 and capacitor 34 in connection with the remaining components of the amplifier stage 12u c inherently produces additional phase shifting of the FET output signal on the FET output line 26 respecting the input signal at the gate of the FET 20. This additional phase shifting is combined with the phase shifting effect of the resistive feedback configuration comprising the feedback resistor 28 and the feedback capacitor 30, thereby producing a combined total phase shift $\theta$ of the amplifier stage 12c. A typical total phase shift $\theta$ of the amplifier stage 12c may be, for example, 225 degrees.

Thus, and for example, if the zero phase active oscillator 10 has three substantially identical cascaded active amplifier stages 12a, 12b and 12c each with a stage phase shift $\theta$ of 225 degrees at the oscillating frequency of the oscillator 10, then the cumulative phase shift of the three cascaded amplifiers is equal to 675 degrees or 315 degrees (modulo 360 degrees). As such, the transmission delay element 16 is then required to have a transmission delay phase shift of 45 degrees at the oscillating frequency so as to effect an oscillator loop phase shift of 360 degree, that is, to effect a zero phase shift (modulo 360 degrees) through the oscillator loop at the oscillating frequency.

Figure 3:
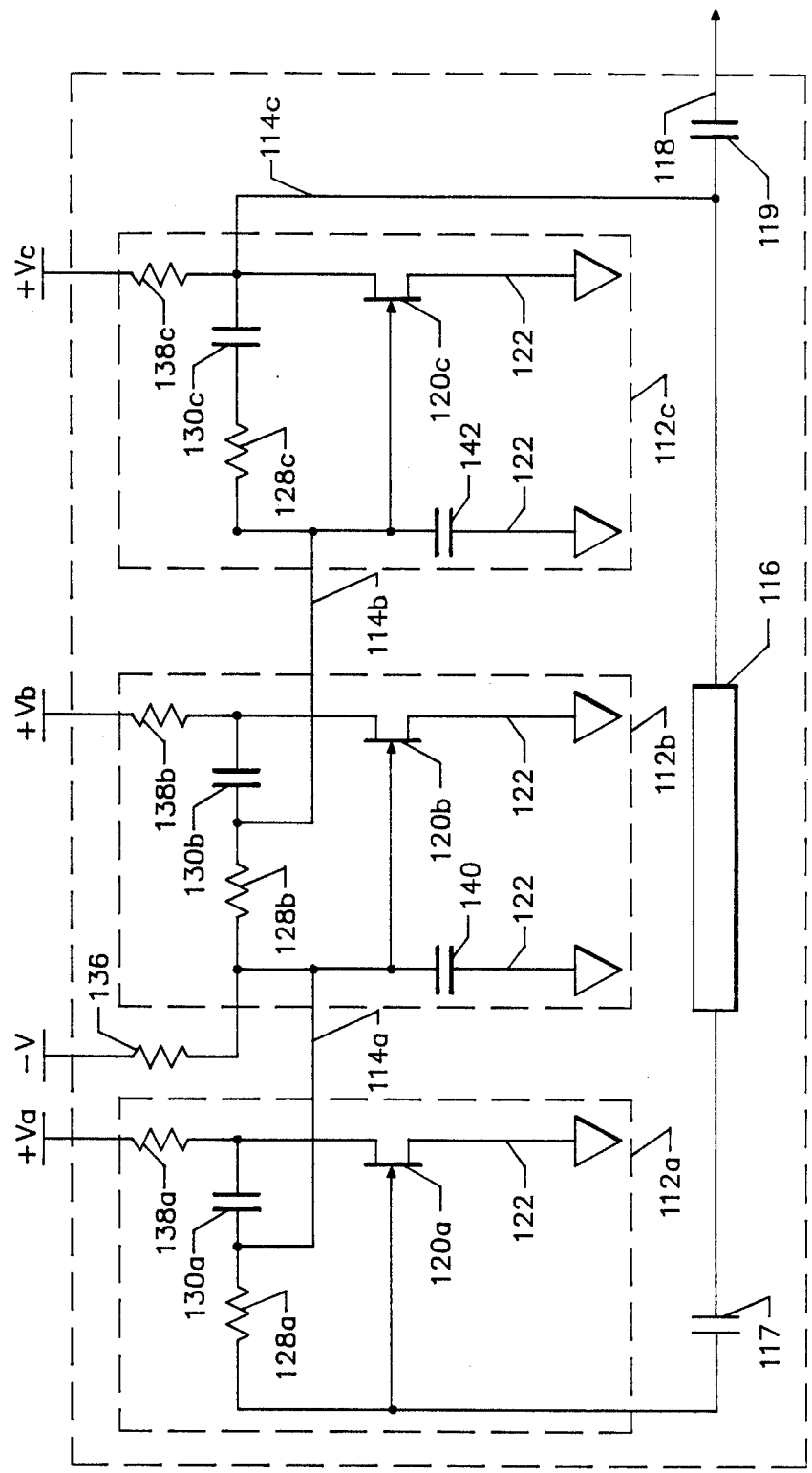
FIG. 3 is a schematic diagram of a zero phase shift active oscillator.

As a best mode in carrying out the invention herein disclosed, reference is made to FIG. 3 which is a schematic diagram of a zero phase shift active oscillator 110. This particular oscillator designed in hybrid technology has a reduced part count to further improve the operating tolerances and the yields of the oscillator 110 during manufacture.

The oscillator 110 has three substantially identical cascaded active amplifier stages 112a, 112b and 112c with each having a stage output line 114a, 114b and 114c, respectively. The stage output line 114c of the last stage 112c is connected to a transmission delay element 116. Though other transmission delay element designs may be used, for example, a resistive-capacitive network, the transmission delay element 116 is made of a 0.1 inch by 0.0026 inch rectangular film metal producing a 24 degree transmission delay phase shift at the oscillating frequency.

An output signal of the transmission delay element 116, which is the output signal of the last amplifier stage 112c on output line 114c shifted 24 degrees, is coupled and fed back to the input of the first amplifier stage 112a through a coupling capacitor 117. Additionally, the output of the last amplifier stage 112c is presented onto the oscillator output line 118 coupled through a coupling capacitor 119. Capacitors 119 and 117 are approximately 5.1 pf.

Each of the amplifier stages 112 have a single gallium arsenide schottky gate field effect transistor (FET) 120 with a dynamic range between two to six GHz particularly suitable for RF and microwave applications. This FET 120 is manufactured by AVANTEK Inc. Santa Clara, Calif. with a part number of AT-8111 The FET 120 is a single semiconductor chip usable in hybrid circuits. However, other FETs may be built and used. For example, a single semiconductor monolithic substrate supporting all the FETs 120 and the other components may be used to process the oscillator 110 on a single semiconductor die thereby further improving yields and improving parameter matching among the various components of the oscillator 110.

The source of each of the FETs 120 is connected to a ground line 122 which is in turn connected to a ground voltage source. Feedback resistors 128 at approximately 1200 ohms and feedback capacitors 130 at approximately 5.1 pf are connected in series and are used to feedback a FET output signal at the drain terminal to the gate terminal of the FET 120.

The first and second cascaded active amplifier stage 112a and 112b have output signals on outputs lines 114a and 114b, respectively, which are connected to both feedback resistor 128 and feedback capacitor 130, while the last cascaded active amplifier stage 112c has an output signal on output line 114c which is connected to the drain terminal of FET 120c. This differing cascaded stage design provides for component count minimization while maintaining identical phase shifting for each of the stages 112.

However, other oscillator designs may incorporate differing amplifier stage designs with correspondingly differing phase shifts. For example, some of the amplifiers 112 may have differing capacitive values for feedback capacitors 130.

A single 350 ohms negative bias resistor 136 is connected to a negative $-1.5$V power source $-$V so as to negatively bias each of the gate terminals of the FETs 120 by virtue of a resistive path between the negative power source $-$V and the gate terminals of the FETs 120.

Three separate 350 ohms positive bias resistors 138a, 138b and 138c are connected to three separate positive voltage sources $+$Va, $+$Vb and $+$Vc, respectively. The resistors 138a, 138b, and 138c are then connected to the drain terminals of the FETs 120a, 120b and 120c, respectively, so as to positively bias the stage output signals on lines 114a, 114b and 114c, respectively, of stages 112a, 112b and 112c, respectively. The positive voltage sources $+$Va, $+$Vb and $+$Vc are approximately $+8.0$ volts with each marginally adjusted up to $\pm 0.5$ volts, so as to set the phase shift of each of the amplifier stages 112 and more precisely set the cumulative phase shift of the cascaded amplifier stages 112.

Filter capacitors 140 and 142 are connected between the gate terminal of FETs 120b and 120c, respectively, and the ground line 122. Capacitor 140 is approximately 2.2 pf and capacitor 142 is approximately 5.1 pf. The small capacitive values of all the capacitors permit fabrication of relatively small capacitors well suited for monolithic semiconductor or hybrid processes.

It should now become apparent that the each amplifier stage 112a, 112b or 112c has a capacitor 140, 142 or 117, respectively, connected to the output lines 114a, 114b and 114c, respectively, so as to provide filtering and phase shifting. The filtering effect of these capacitors 140, 142 and 117 is determined by the real resistance values across the capacitors 140, 142 and 117 as is well known in the art.

Each amplifier stage 112a, 112b or 112c has a DC blocking capacitor 130a, 130b or 130c, respectively. Also, each amplifier stage 112a, 112b or 112c has a positive bias resistor 138a, 138b or 138c, respectively, connected to the respective drains of the FETs 120a, 120b or 120c, respectively. Finally, gates of the FETs 120 are negatively biased by virtue of the resistive path comprising resistor 136, in series with resistors 128a and 128b.

The oscillator design depicted in FIG. 3 as hereinabove setforth provides for an amplifier stage phase shift of 232 degrees at an oscillator oscillating frequency of 1.5 GHz. The oscillators herein disclosed have excellent repeatability during manufacture and require substantially less semiconductor or hybrid real estate thereby improving yields with consequential lower fabrication costs.

Other particular amplifier stage and oscillator designs and modifications may be conceived and manufactured by those skilled in the art. Those designs and modifications may nevertheless represent applications and principles within the spirit and scope of the instant invention as defined by the following claims.

What is claimed is:

1. An oscillator circuit which receives power from a power source comprising:
   a plurality of amplifier stages, at least one of the stages having its own phase shift at a selected oscillating frequency, the plurality of amplifier stages being coupled in series, at least one of the plurality of stages comprising:

at least one active component means for providing amplification, the at least one component means having an input and an output, a resistive feedback path for providing negative feedback and phase shifting between the input and the output of the at least one component means, means coupled to the output of the at least one component means for filtering noise and for introducing additional phase shifting of the at least active component means, means coupled between the output of the at least one component means and the input of another stage of the plurality of amplifier stages for blocking DC voltages between the plurality of stages, and means coupled between the power source and the input and the output of the at least one component means for biasing the at least one component means into an operating range of the at least one component means; and transmission delay element means coupled with at least one of the plurality of amplifier stages for providing a second phase shift such that the total loop phase shift of the oscillator circuit is equal to zero at the oscillating frequency.

2. The oscillator circuit of claim 1 in which the transmission delay element comprises a conductive path wherein the conductive path is a conductive metal.

3. The oscillator circuit of claim 2 in which the conductive metal comprises a rectangular sheet of film metal.

4. The oscillator circuit of claim 2 in which the at least one active component means comprises a field effect transistor.

5. The oscillator circuit of claim 2 in which the resistive feedback path comprises a resistor and a capacitor coupled together in series.

6. The oscillator circuit of claim 3 in which the DC blocking means comprises a capacitor.

7. The oscillator circuit of claim 3 in which the biasing means comprises:

resistive means coupled between a negative voltage source of the power source and the input of the active component means; and resistive means coupled between a positive voltage source of the power source and the output of the active component means.

8. The oscillator circuit of claim 3 in which the filtering means comprises a capacitor.

9. The oscillator circuit of claim 8 in which the filtering means further comprises a resistor coupled in parallel with the capacitor.

10. An oscillator circuit oscillating at a selected frequency, the circuit structured in a loop configuration comprising:

a plurality of cascaded amplifier stages, each of the stages having its own predetermined phase shift at the selected frequency, at least one of said cascaded amplifier stages including a transistor having first, second and third terminals, said third terminal being coupled to ground, and means for providing a resistive feedback path between said first and second terminals;

a first capacitive means coupled to the resistive feedback path; and a parallel resistive-capacitive network coupled between the first and third terminals of said transistor and means coupled to at least one of the plurality of amplifier stages for providing a second predetermined phase shift.

11. An oscillator circuit oscillating at a selected frequency the circuit structured in a loop configuration comprising:

a plurality of cascaded amplifier stages, each of the stages having its own predetermined phase shift at the selected frequency, at least one of said cascaded amplifier stages including a transistor having first, second and third terminals, said first terminal being coupled to ground, and means for providing a resistive feedback path between said second and third terminals;

a first capacitive means coupled to the resistive feedback path; and a parallel resistive-capacitive network coupled between the first and third terminals of said transistor and means coupled to at least one of the plurality of amplifier stages for providing a second predetermined phase shift.

12. A zero shift oscillator comprising:

a plurality of amplifying means, the plurality of amplifying means coupled in series, each of the amplifying means having its own predetermined phase shift at a selected oscillator frequency at least one of said amplifying means including a transistor having first, second and third terminals, said third terminal being coupled to ground, means for providing a resistive feedback path between said first and second terminals, a first capacitive means coupled to the resistive feedback path, and a parallel resistive-capacitive network coupled between the first and third terminals of said transistor, and a transmission delay means coupled to at least one of the plurality of amplifying means, the delay means having a second predetermined phase shift at the selected oscillator frequency, wherein the total phase shift of the oscillator is zero degrees at the selected oscillator frequency.

13. A zero phase shift oscillator comprising:

a plurality of amplifying means, the plurality of amplifying means coupled in series, each of the amplifying means having its own predetermined phase shift at a selected oscillator frequency, at least one of said amplifying means including a transistor having first, second and third terminals, said first terminal being coupled to ground, means for providing a resistive feedback path between said second and third terminals, a first capacitive means coupled to the resistive feedback path, and a parallel resistive-capacitive network coupled between the first and third terminals of said transistor, and a transmission delay means coupled to at least one of the plurality of amplifying means, the delay means having a second predetermined phase shift at the selected oscillator frequency, wherein the total phase shift of the oscillator is zero degrees at the selected oscillator frequency.

14. The oscillator circuit of claim 10 wherein said transistor is an FET transistor and said first, second and third terminals are drain, gate and source terminals respectively.

15. The oscillator circuit of claim 11 wherein aids transistor is an FET transistor and said first, second and third terminals are drain, gate and source terminals respectively.

16. The oscillator circuit of claim 12 wherein said transistor is an FET transistor and said first, second and third terminals are drain, gate and source terminals respectively.

17. The oscillator circuit of claim 13 wherein said transistor is an FET transistor and said first, second and third terminals are drain, gate and source terminals respectively.

18. An oscillator comprising:
a plurality of cascaded amplifier stages, at least one stage including
an amplifier including a transistor having first, second and third terminals, said second terminal being the input terminal and said third terminal being coupled to ground, and
means for providing a resistive-capacitive feedback path between said first and second terminals, and
means, coupled to said amplifier, for adding a predetermined phase shift to the output thereof.

19. The oscillator of claim 18 including a parallel resistive-capacitive network coupled between the first and third terminals of said transistor.

20. An oscillator comprising:
a plurality of cascaded amplifier stages, at least one stage including
an amplifier including a transistor having first, second and third terminals, said second terminal being the input terminal and said third terminal being coupled to ground, and
means for providing a resistive-capacitive feedback path between said first and second terminals, and
a parallel resistive-capacitive network coupled between the first and third terminals of said transistor.

* * * * *